Oct. 13, 1970 R. W. BOWER 3,533,158

METHOD OF UTILIZING AN ION BEAM TO FORM CUSTOM CIRCUITS

Filed Oct. 30, 1967

Robert W. Bower,
INVENTOR.
BY.

W H McAllister Jr.

ATTORNEY.

United States Patent Office 3,533,158
Patented Oct. 13, 1970

3,533,158
METHOD OF UTILIZING AN ION BEAM TO FORM CUSTOM CIRCUITS

Robert W. Bower, Palos Verdes, Calif., assignor to Hughes Aircraft Company, Culver City, Calif., a corporation of Delaware Filed Oct. 30, 1967, Ser. No. 678,808
Int. Cl. H01l 11/24
U.S. Cl. 29—571 9 Claims

ABSTRACT OF THE DISCLOSURE

Custom MOSFET circuits are formed by selectively scanning an array of incomplete, or latent, insulated-gate offset-drain transistors with an ion beam of predetermined dopant species and dimension to activate the devices and complete the circuit.

This invention relates to ion bombardment of semiconductor devices and especially to the activation thereof. More particularly the invention relates to the implantation of impurity ions upon the surface and into the near-surface of semiconductor bodies by means of scanning said bodies with an ion beam of predetermined dopant species and dimensions.

In my copending application, Ser. No. 590,033 filed Oct. 27, 1966, entitled "Field-Effect Device With Insulated Gate" and assigned to the assignee of the present invention, I describe methods of fabricating an IGFET device employing as one step of the process thereof the technique of ion implantation upon a surface of a semiconductor body.

As taught in this application, source and drain regions, which define the channel region, may be formed after the gate is disposed on the semiconductor body, by using the gate as a mask to precisely establish the boundaries of the channel. This method of fabrication comprises first providing an oxide insulating layer on the surface of the semiconductor body; then forming a gate in a predetermined position on the oxide layer; then using the gate as a mask, forming the source and drain regions by implanting into the semiconductor body through the oxide layers adjacent to the gate-mask, appropriate conductivity-type-determining impurities. These impurities are thus implanted where desired and determine the conductivity type of the semiconductor regions implanted thereby.

In my copending application, Ser. No. 631,263 filed Apr. 17, 1967, entitled "Field-Effect Device With Insulated Gate" also assigned to the assignee of the present invention, I describe an IGFET device fabricated similarly but including in every embodiment thereof a metal-oxide layer upon the substrate surface, hence comprising a metal-oxide-semiconductor field effect transistor (MOSFET).

Before proceeding to discuss the present invention, it may be helpful to define the acronyms employed hereinbefore and to briefly explain the phenomena associated with the technique of ion implantation:

An insulated-gate field-effect transistor, or IGFET, comprises a conductive path, or "channel," of low-resistivity semiconductor material for transmitting majority charge carriers which flow from a "source"-electrode toward a "drain"-electrode. Current flowing through the channel from the source region to the drain region is controlled or modulated by means of a "gate"-electrode which is insulated from the semiconductor material and formed over the channel between source and drain. When a drain voltage is applied across the source and drain, a drain current flows through the channel, and the magnitude of this current would appear to be a function of the drain voltage applied and the number of carriers in the channel; but since the number of carriers in the channel may be controlled or modulated by a gate voltage applied to the gate electrodes, such modulation causing either a variable reduction or a variable increase in carriers, the magnitude of the current is actually a function of the gate voltage only, having a drain voltage-drain current characteristic similar to that of a vacuum pentode. IGFET is a general term, referring to a device.

A metal-oxide-semiconductor field-effect transistor, or MOSFET, also comprises a gate formed on the surface of an insulator on a semiconductor body and over the channel between source and drain, and is in a sense a preferred embodiment of an IGFET. The gate is metal and the insulator is usually an oxide layer which may be formed by oxidizing the surface of the semiconductor body; and since conductivity of the channel is controlled or modulated by the field on the insulated gate, modulation of the source-drain current is achieved thereby.

FIGS. 1 and 2 are provided herewith as examples of the devices of my copending application cited above, a plurality of said devices comprising the system of FIGS. 3 and 4, completion of which is achieved by means of the method of the present invention.

An incomplete, or latent, IGOST device is shown in FIG. 1, where a gate is seen to be positioned over the source region but not over the drain region. It is apparent that this structure will function as an open circuit until a critical source-to-drain voltage is applied.

To complete the circuit for operation as a MOSFET, it is necessary to fill in the drain region up to the gate, by means of diffusion or other means, or more advantageously by means of ion implantation as taught in the copending applications hereinabove referenced. Referring to FIG. 2, an ion-implanted region is seen, so labeled extending from the drain to the insulated gate. Following is a brief discussion of the ion implantation technique which may be helpful:

In an ion implantation process, impurity atoms are first ionized, and then by means of divers electric and/or magnetic fields these ions may be formed into beams of various diameters and shapes and may also be caused to travel in predetermined directions at predetermined velocities. Hence in direct contrast to a conventional diffusion process—where available atoms are usually in vapor state, and may make contact with an exposed surface of a semiconductor body only in accordance with thermodynamic conditions present—conductivity-determining impurity ions may be made to enter a semiconductor surface film lattice in a predetermined direction at a predetermined velocity, and may be placed precisely therein in a prescribed concentration and controlled to a desired degree of uniformity or gradation.

The present invention utilizes the IGOST device as above described, calling for the construction of an array thereof, fabricated to the step in the process where ion implantation is to be performed in order to complete the circuit configurations. Subsequent steps in said fabrication process, by means of selected ion implantations, or "activation," of said device arrays, provide custom circuits having predetermined functions.

It is therefore an object of the present invention to provide an improved method for making a custom circuit having predetermined functions.

It is therefore an object of the present invention to provide an improved method for making a custom circuit having a predetermined function.

A further object of the invention is to provide an improved method for making a custom MOSFET circuit from an array of latent IGOST devices including fixed interconnections.

Another object of the invention is to provide an improved method for making a custom MOSFET circuit from an array of latent IGOST devices including active gain devices within each gate to transfer from gate to gate.

Still another object of the invention is to provide an improved method for making a custom MOSFET circuit from an array of latent IGOST devices by scanning said array with a broad, programmed ion beam to selectively implant or activate said devices for completion of said circuit.

These and other objects and advantages of the present invention are achieved by first partially performing a diffused source and drain as described in my afore-mentioned copending applications, having the gate structure cover only the diffused source and not the diffused drain. A device thus formed draws no drain current for any value of gate voltage when the drain voltage is below a critical drain-to-substrate voltage, such that the drain depletion layer does not extend to the region beneath the gate. For drain voltages greater than this critical value, the device acts as a normal pentode. If a device of the structure described is ion-implanted utilizing, for example, a method such as that of the present invention, so as to extend the diffused drain over to the gate, the device will operate as a normal pentode for all values of drain-substrate voltage, hence operating like a normal high-frequency MOSFET.

This invention will be described in greater detail by reference to the drawings in which.

Figure 1:
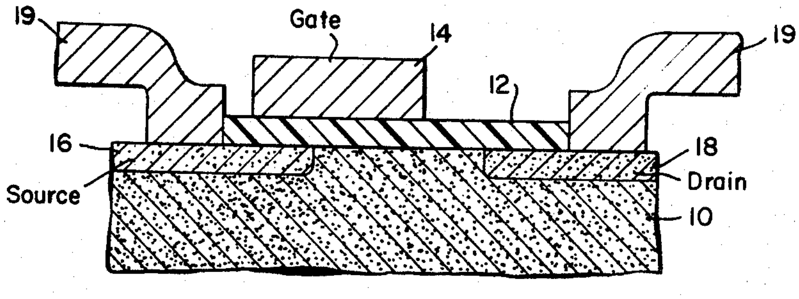
FIG. 1 is a cross-sectional elevational view of a portion of an insulated-gate offset-drain-transistor (IGOST) in an incomplete, or latent, condition.

Referring now to FIG. 1, a portion of an insulated-gate offset-drain transistor (IGOST) is shown which includes a semiconductor body 10 of, for example, N-type silicon. Disposed on the surface of the silicon body 10 is an oxide layer 12 which typically may be silicon dioxide and acts as an insulator for a gate electrode 14. The gate electrode 14 may be formed by vapor-deposition of a suitable metal such as aluminum, for example, using conventional masking techniques. Source and drain regions 16 and 18 of P-type conductivity are formed by conventional diffusion techniques, the gate electrode 14 being disposed to cover only the diffused source and not the diffused drain. Metallization 19 extends between devices as indicated. This structure is known in the art as an incomplete, or latent, IGOST.

Figure 2:
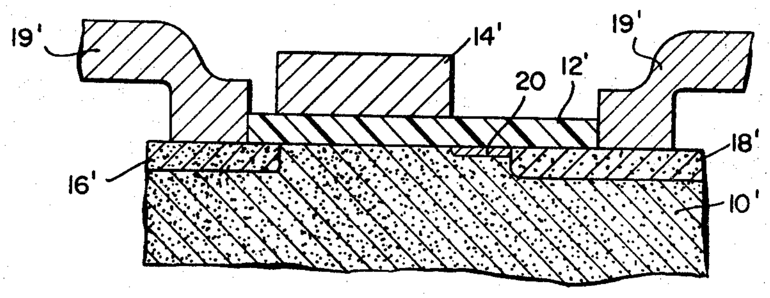
FIG. 2 is a view as in FIG. 1, showing additionally an ion-implanted, or activated, region which completes the structure.

Referring now to FIG. 2, an ion-implanted, or activated, region 20 is shown which has been extended from the drain 18 to the gate electrode 14 in order to effect completion of the IGOST device, now operating with the pentode characteristics of a functioning MOSFET. The region 20 has been formed by means of the impingement thereupon of a beam of ions capable of establishing a desired conductivity-type. In this case of an N-type semiconductor body, P-type or acceptor impurity is the desired conductivity type.

Figures 3, 4:
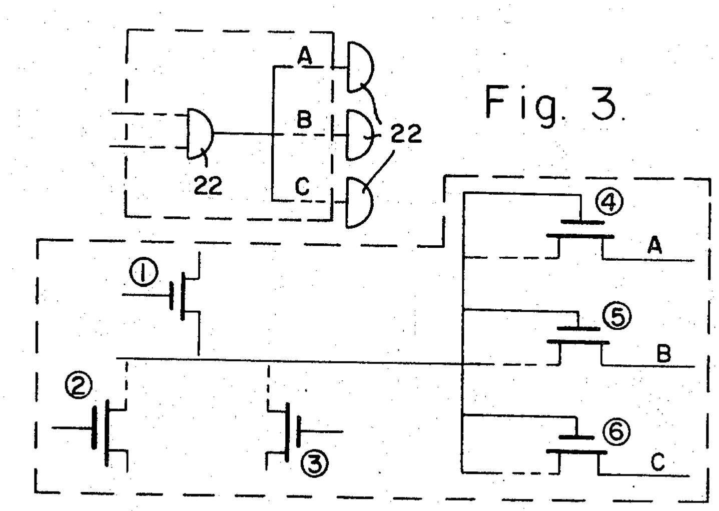
FIG. 3 is a variable logic diagram of an array of activated IGOSTS, or MOSFET circuit.
FIG. 4 is a schematic diagram of the circuit of FIG. 3.

Referring now to FIG. 3, a variable logic diagram is shown of a MOSFET circuit of a type, for example, suitable for fabrication according to the method of the present invention. A general array is indicated, where three devices, A, B and C, are shown to be interconnected, and wherein the dashed lines indicate the potential paths of interconnection between gates 22 which can be activated by extending the drain in a given device to a corresponding gate by means of ion implantation. The diagram is in the form of a NOR gate as used in digital circuitry.

Referring now to FIG. 4, a realization of the MOSFET circuit of FIG. 3 is shown, wherein IGOSTS A, B, C are schematically interconnected with dashes to indicate incomplete circuits. Gate 1 is a resistor; gates 2 and 3 are active gain devices within a gate; and gates 4, 5 and 6 are transfer devices from gate to gate. It should be noted in connection with a description of gates 4, 5 and 6 that they could in another embodiment be constructed by diffusion technique and bridged with a thin film of oxide, and employ no gates.

Figure 5:
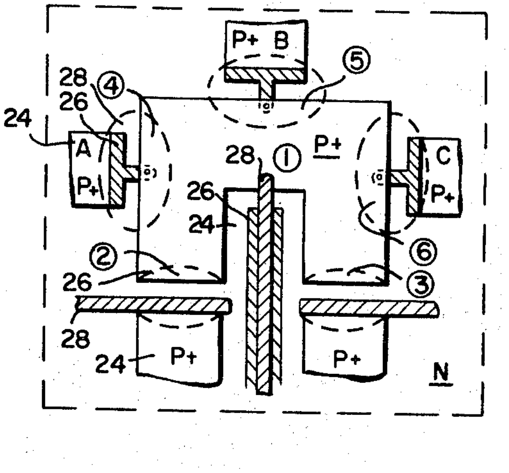
FIG. 5 is a diagrammatic view shown partially in section of the circuit of FIGS. 3 and 4 as a device.

Referring now to FIG. 5, a topological layout of a MOSFET circuit is shown to implement the diagram of FIG. 3 and the schematic realization of FIG. 4. Devices A, B, C and gates 1–6 are indicated as above. Sources 24, drains 26 and gates 28 are indicated and gate metallizations are coded accordingly. A thick oxide layer (not shown) as silicon dioxide, for example, is disposed over the region where gates 4, 5 and 6 extends into the P-region indicated. The dashed lines outline the region within which an ion needs to impinge upon the incomplete, or latent, IGOST in order to extend the drain to the gate and complete a given device.

There thus has been described a novel method of utilizing an ion beam to form custom circuits employing MOSFETS more easily and economically than heretofore. Whereas prior art systems make use of fixed arrays of individual devices, active or passive, with custom-applied interconnections, the method of the invention makes use of an ion beam, custom-applied, to activate devices having a fixed array of interconnections.

An additional useful feature of the method of the invention is the selective ion-implanation of devices partially formed on wafers having interconnect systems stockpiled thereupon: for example, IGOSTS can be partially formed by diffusion, then stored, awaiting the final step of ion implantation by means of irradiating with an ion beam.

Further advantages of the present invention reside in the requisite fabrication techniques. The circuits are topologically easier to fabricate, since the devices are 1-dimensional (points) and the interconnects 2-dimensional. Since only rough positioning is required, masks for focusing are not needed and the ion beam employed for activation can be a relatively broad, or macro, beam, as large as 4 mils, or a few thousandths of an inch. Scanning the array with a programmed beam of such size presumes loose tolerances in spot size and positioning requirements, since although a beam of predetermined dopant species need only impinge upon the region of the device between the edge of the diffused drain and the gate, function of the device will not be influenced if the beam impinges elsewhere on the device. Spot size tolerances would be substantially 100 microns in diameter and positional accuracy could vary as much as the order of 20 microns. To form a specific function from a given general array, it is only necessary to scan the general array with a programmed ion beam as above-described, and to irradiate only those devices with the impinging ion stream which will cause the general array to take the form of the specific function desired.

The low yield factor in the conventional construction of metallization masks, where each device on a circuit chip is monitored individually, is overcome in the use of the gate-mask herewith. It is characteristic of a MOSFET fabricated by the method of the invention that for power supply voltages below a critical value, an array of these devices would not function. When the drain voltage is below a drive-to-substrate voltage where the drain depletion layer extends beneath the gate, the array will not function; if the substrate voltage is modified so that the drain potential exceeds the critical value, then the array has terminal characteristics associated with the general pattern of interconnections determined by the metallization and diffusion paths. Operation of the array in this mode, with the drain voltage greater than the critical value, will furnish information regarding the terminal characteristics of the array regardless of the operation of the device. Bad gates can be avoided in terms of the final network formed. The method of the invention lends itself unusually well to utilization in forming circuits for complex large arrays, particularly in the field of integrated circuits.

What is claimed is:

1. The method of utilizing an ion beam to form custom circuits by means of selective activation of incomplete devices in an array comprising the steps of:
(a) in each device, partially preforming source and drain regions in a semiconductor body including a channel therebetween;
(b) in each device, forming a gate electrode on the surface of an oxide insulator, said insulator being on the surface of said semiconductor body, said gate being disposed to cover only said source and not to cover said drain;
(c) forming a general array of said devices, said array having therewithin a metallization and a pattern including a pattern of interconnections; and
(d) selectively implanting conductivity-type-determining impurity ions into regions of said array to extend said drain regions to said gates, thus forming a functional, normal MOSFET circuit.

2. The method of utilizing an ion beam to form custom circuits by means of selective activation of incomplete devices in an array comprising the steps of:
(a) in each device, partially preforming diffused source and drain regions in a semiconductor body including a channel therebetween;
(b) in each device, forming a gate electrode on the surface of an oxide insulator, said insulator being on the surface of said semiconductor body, said gate being disposed to cover only said diffused source and not to cover said diffused drain;
(c) forming a general array of said devices, said array having therewithin a metallization and diffusion pattern including a pattern of interconnections; and
(d) selectively implanting conductivity-type-determining impurity ions into regions of said array to extend said drain regions to said gates, thus forming a functional, normal MOSFET circuit.

3. The method of utilizing an ion beam to form custom circuits by means of selective activation of fixed arrays of insulated-gate offset-drain transistor devices comprising the steps of:
(a) in each device, partially preforming diffused source and drain regions in a semiconductor body including a channel therebetween;
(b) in each device, forming a gate-mask on the surface of an oxide insulator, said insulator being on the surface of said semiconductor body, said gate being disposed to cover only said diffused source and not to cover said diffused drain;
(c) forming a general array of said devices said array having therewithin a metallization and diffusion pattern including a pattern of interconnections; and
(d) selectively implanting conductivity-type-determining impurity ions into regions of said array to extend said drain regions to said gates, thus forming a functional, normal MOSFET circuit.

4. The method of utilizing an ion beam to form custom circuits by means of selective activation of fixed arrays of insulated-gate offset-drain transistor devices comprising the steps of:
(a) in each device, partially preforming diffused source and drain regions in a semiconductor body including a channel therebetween;
(b) in each device, forming a gate-mask on the surface of an oxide insulator, said insulator being on the surface of said semiconductor body, said gate being disposed to cover only said diffused source and not to cover said diffused drain;
(c) forming a general array of said devices, said array having therewithin a metallization and diffusion pattern including a pattern of interconnections, said devices being incomplete, or latent; and
(d) selectively implanting conductivity-type-determining impurity ions into regions of said array to extend said drain regions to said gates, thus activating said latent devices.

5. The method of utilizing an ion beam to form custom circuits by means of selective activation of fixed arrays of insulated-gate offset-drain transistor devices comprising the steps of:
(a) in each device, partially preforming diffused source and drain regions in a semiconductor body including a channel therebetween;
(b) in each device, forming a gate electrode on the surface of an oxide insulator, said insulator being on the surface of said semiconductor body, said gate being disposed to cover only said diffused source and not to cover said diffused drain;
(c) forming a general array of said devices, said array having therewithin a metallization and diffusion pattern including a partially complete pattern of interconnections;
(d) selectively implanting conductivity - type - determining impurity ions into regions of said array to extend said drain regions to said gates; and
(e) completing said partially complete pattern of interconnections, thus forming a functional, normal MOSFET circuit.

6. The method of utilizing an ion beam to form custom circuits by means of selective activation of fixed arrays of insulated-gate offset-drain transistor devices comprising the steps of:
(a) in each device, partially preforming diffused source and drain regions in a semiconductor body including a channel therebetween;
(b) in each device, forming a gate-mask on the surface of an oxide insulator, said insulator being on the surface of said semiconductor body, said gate being disposed to cover only said diffused source and not to cover said diffused drain;
(c) forming a general array of said devices, said array having therewithin a metallization and diffusion pattern including a pattern of interconnections; and
(d) selectively implanting conductivity - type - determining impurity ions, by means of a scanning ion beam of predetermined dopant species and dimension, in regions of said array to extend said drain regions to said gates, thus forming a functional, normal MOSFET circuit.

7. The method of claim 6, wherein said ion beam is a macro-beam.

8. The method of claim 7, wherein said macro-beam emission may be modified by a mask positionable over a device, with capability to withstand effects of dopant ions and a vacuum of $10^{-6}$ torr at 450° C.

9. The method of claim 7, wherein said macro-beam may be as broad as 4 mils.

References Cited

UNITED STATES PATENTS

| | | | |
|---|---|---|---|
| 3,388,009 | 6/1968 | King | 148—1.5 |
| 3,413,531 | 11/1968 | Leith | 317—235 |

PAUL M. COHEN, Primary Examiner

U.S. Cl. X.R.

29—576, 584; 148—1.5; 317—235